United States Patent
Bradbury

(10) Patent No.: US 8,494,476 B2
(45) Date of Patent: Jul. 23, 2013

(54) MONOLITHIC LNA SUPPORT IC

(75) Inventor: David Bradbury, Manchester (GB)

(73) Assignee: Diodes Incorporated, Plano, TX (US)

( * ) Notice: Subject to any disclaimer, the term of this patent is extended or adjusted under 35 U.S.C. 154(b) by 1238 days.

(21) Appl. No.: 12/092,250

(22) PCT Filed: Oct. 30, 2006

(86) PCT No.: PCT/GB2006/004045
§ 371 (c)(1),
(2), (4) Date: Apr. 30, 2008

(87) PCT Pub. No.: WO2007/052002
PCT Pub. Date: May 10, 2007

(65) Prior Publication Data
US 2008/0284516 A1 Nov. 20, 2008

(30) Foreign Application Priority Data

Nov. 1, 2005 (GB) .................................. 0522172.6

(51) Int. Cl.
*H04B 1/16* (2006.01)
(52) U.S. Cl.
USPC .................. 455/341; 455/343.1; 455/3.02
(58) Field of Classification Search
USPC ............... 455/280, 250.1, 126, 127.1, 575, 455/73, 141, 209, 3.02, 334, 323, 341, 343.1; 330/253, 254, 269, 277, 307, 285, 295, 136, 330/124; 257/7
See application file for complete search history.

(56) References Cited

U.S. PATENT DOCUMENTS

| | | | |
|---|---|---|---|
| 5,426,641 | A | 6/1995 | Afrashteh et al. |
| 5,903,854 | A | 5/1999 | Abe et al. |
| 6,735,424 | B1 | 5/2004 | Larson et al. |
| 6,957,039 | B2 | 10/2005 | Imai |
| 2003/0129960 | A1 | 7/2003 | Kato et al. |
| 2004/0192190 | A1* | 9/2004 | Motoyama ................... 455/3.02 |
| 2005/0066367 | A1 | 3/2005 | Fyke et al. |
| 2005/0122171 | A1 | 6/2005 | Miki et al. |

FOREIGN PATENT DOCUMENTS

| | | |
|---|---|---|
| CN | 1144427 A | 3/1997 |
| CN | 2520568 Y | 11/2002 |
| CN | 1141787 C | 2/2003 |
| EP | 0963036 A2 | 12/1999 |
| EP | 1089469 | 4/2001 |
| FR | 2 853 167 | 10/2004 |

(Continued)

OTHER PUBLICATIONS

PCT International Search Report for PCT/GB2006/004045, Jan. 29, 2007, 5 pages.

(Continued)

*Primary Examiner* — Christian Hannon

(57) ABSTRACT

A low noise amplifier (LNA) comprises: a plurality of FETs (F1, F2, F3, F4) arranged to process signals received by the amplifier; a power input (10) arranged to receive electrical power to operate the LNA; and a monolithic support integrated circuit (IC). The monolithic support IC comprises: a FET control circuit (2) arranged to monitor and control the drain current of each FET; a FET selection circuit (3, 24, 22) arranged to detect the level of a DC component of a voltage signal supplied to the power input and to provide a FET selection signal to the FET control circuit (2) according to the detected DC level.

38 Claims, 11 Drawing Sheets

FOREIGN PATENT DOCUMENTS

| | | |
|---|---|---|
| GB | 2235340 | 2/1991 |
| GB | 2339093 A | 12/2000 |
| JP | 10-093459 | 4/1998 |
| JP | 2003-87062 | 3/2003 |
| JP | 2003-188653 | 7/2003 |
| WO | WO2005036608 | 4/2005 |

OTHER PUBLICATIONS

PCT Written Opinion for PCT/GB2006/004040, Jan. 29, 2007, 5 pages.
Chinese Office Action dated Jul. 6, 2010 for application No. 200680050075.4, 8 pages.
Russian Office Action for application No. 2008117026/09(019435) dated May 7, 2010, 5 pages (plus 4 pages of translation).
UK Search Report for GB0522172.6, Jan. 16, 2006, 1 page.
UK Examination Report under Section 18(3) for GB0522172.6, Feb. 20, 2009, 3 pages.
Supplemental European Search Report for application No. 06 794 946.1-1233, Mar. 11, 2011, 5 pages.

* cited by examiner

MONOLITHIC LNA SUPPORT IC

FIELD OF THE INVENTION

The present invention relates to low noise amplifiers (LNAs) and in particular to monolithic support integrated circuits (ICs) for incorporation in LNAs to control, inter alia, the biasing of FETs incorporated in the LNA for processing received signals.

BACKGROUND TO THE INVENTION

LNAs are a well-known type of electronic amplifier used in communication systems to amplify very weak signals captured by an antenna. They are typically located at the antenna and are designed so as to add very little noise to the received signal. The LNAs amplify the received signals to a level required by subsequent receiving equipment to which the LNA is attached. They may also be referred to as signal boosters.

One known application of LNAs is to receive and amplify direct broadcast satellite (DBS) signals, and LNAs adapted for this purpose may be referred to as DBS LNAs. DBS LNAs typically comprise a number of FETs (which may be GaAs FETs) for processing radio frequency (RF) signals. For example, the DBS LNA may be adapted to receive signals having two different polarisations, and two FETs may be used to select which one of the input signal polarisations is amplified and passed on to subsequent connected equipment. Also, a FET may be arranged in an active mixer circuit to receive an RF input, with the gate or drain of the FET being driven by a signal from a local oscillator in the LNA. The active mixer circuit is then able to output (i.e. extract) an intermediate frequency (IF) signal.

DBS LNAs are typically required to detect very low-level RF signals covering a wide frequency range, and provide high channel-to-channel isolation. They should also be able to amplify received signals whilst introducing negligible noise, and be controllable to select between different input signal polarisations (as discussed above). It is known for them to be controllable to band switch so as to be able to receive and process signals over an increased frequency range. It is known for them to be able to down convert, that is to be able to receive an input signal at a particular frequency and output a corresponding signal at a lower frequency. Another feature of known DBS LNAs is cable drive, that is the LNA is powered and controlled via the same RF cable that is used for downfeeding the RF output of the LNA to connected equipment (such as a "set top box").

In the past, DBS LNAs have typically incorporated a number of separate internal circuit blocks on a printed circuit board (PCB), these blocks including: a block providing FET bias control and protection stages; a block arranged to generate a negative supply voltage for use in FET control; a block arranged to detect the level of a DC input voltage for use in polarisation switch control; a block arranged to detect an AC input voltage for use in band switch control; a block arranged to control switching of power to local oscillators, and block arranged to provide a regulated power supply. These numerous separate blocks in known LNAs had to be accommodated on relatively large area PCBs, and have taken up 50% or more of the total LNA PCB area. This has added cost to the overall LNA, this cost not just being associated with the separate components and the PCB (which has typically been made from expensive low-loss RF material), but also the LNA housing material (alloy and plastic).

SUMMARY OF THE INVENTION

According to a first aspect of the present invention there is provided a low noise amplifier (LNA) comprising:
a plurality of FETs arranged to process signals received by the amplifier;
a power input arranged to receive electrical power to operate the LNA; and
a monolithic support integrated circuit (IC),
wherein the monolithic support IC comprises;
a FET control circuit arranged to monitor and control the drain current of each FET;
a FET selection circuit arranged to detect the level of a DC component of a voltage signal supplied to the power input and to provide a FET selection signal to the FET control circuit according to the detected DC level, the FET control circuit being responsive to the FET selection signal to disable a selected one of two of the plurality of FETs;
a voltage regulator circuit connected to the power input and adapted to generate a regulated output voltage from (using) a voltage signal to the power input; and
a negative supply generator circuit connected to receive the regulated output voltage and arranged to generate a negative supply voltage from (using) the regulated output voltage and to provide the negative supply voltage to the FET control circuit, the FET control circuit being arranged to use the negative supply voltage to provide negative gate drive voltages to the FETs.

The power input may be a signal output, such as an RF signal output, the LNA being arranged to output amplified signals from said signal output for receipt by apparatus connected to the signal output.

In certain embodiments the FETs are GaAs FETs.
The LNA may further comprise means for adjusting the drain current of said FETs, and this means for adjusting may comprise a resistor, the resistance of which determines the drain current of the FETs. This current may be fixed during design or adjusted during LNA manufacture (to set gain, IP3 etc.). The resistor in certain embodiments is connected between ground and the FET control circuit.

In certain embodiments the FET control circuit is arranged to control the drain current, drain voltage, gate current, and gate voltage of each FET.

The negative supply generator may be arranged to provide the negative supply voltage to at least one component of the LNA that is external to the monolithic support IC. Examples of such external circuits include alternate active mixers, MIMIC local oscillator support etc.

The voltage regulator circuit may be arranged to supply all power required to operate the components of the LNA external to the monolithic support IC.

The LNA may further comprise two local oscillators, and the monolithic support IC may further comprise:
an AC signal detection circuit arranged to detect an AC component of a voltage signal supplied to the power input and to provide an AC component detection signal according to the detected AC component; and
a local oscillator (LO) control circuit arranged to receive the AC component detection signal and to selectively operate one of the two local oscillators according to the received AC component detection signal.

In certain embodiments the local oscillator control signal is arranged to selectively operate the local oscillators by selectively switching power supply to the local oscillators.

The local oscillators may be MIMIC oscillators each requiring a gate drive to operate, and the LO control circuit may selectively operate the LOs by switching the gate drive. MIMIC local oscillators are very simple integrated circuits typically comprised of two GaAs FETs optimised for oscillator use.

The selection of LO operation is arranged, in some embodiments, to determine a frequency band of operation of the LNA.

The FET control circuit is arranged in certain embodiments to limit the drain current of each FET in the event of a fault condition. For example, the FET control circuit may be arranged to limit the increase in drain current under a fault condition to no more than 20%.

The fault condition may, for example be: an FET gate short circuit; an FET drain short circuit; any other loading fault.

In certain embodiments, the FETs have respective voltage ratings, and the FET control circuit is arranged to provide gate drive voltages to the FETs and to regulate each gate drive voltage so as to be within the voltage rating of the respective FET.

In some embodiments the two FETs selectively disabled by the FET control circuit in response to the FET selection circuit comprise a first FET arranged to process a received signal having a first polarisation, and a second FET arranged to process a received signal having a second polarisation, whereby the FET selection circuit, by selectively disabling either the first or the second FET, controls which received signal polarisation the LNA amplifies.

The FET control circuit may be arranged to disable the selected FET by applying a gate voltage to completely cut off drain current through the FET.

The FET control circuit may also be arranged to disable the drain supply to the de-selected FET (i.e. the drain pin is switched open circuit, allowing active and inactive FET drains to be wired together).

Alternatively, the FET control circuit may be arranged to disable the selected FET by disabling the drain supply to that FET and applying a gate voltage to that FET to drive it into a low resistance state.

In certain embodiments the FET selection circuit comprises means for rejecting interference signals contained in the voltage signal supplied to the power input in addition to the DC component. This means for rejecting interference signals may comprise at least one of: a filter; and a delay circuit.

The AC signal detection circuit may comprises means for rejecting interference signals contained in the voltage signal supplied to the power input in addition to the AC component.

The AC signal detection means' means for registering interference signals may comprise at least one of: a filter; a level detector; a modulation detector; and a delay circuit.

In certain examples the voltage regulator circuit comprises over-temperature protection means (i.e. in the event of an over-temperature condition, the output of the regulator should be disabled or switched to zero).

The voltage regulator circuit may comprise over-current protection means (i.e. a load greater than the pre-determined limit should cause the output voltage of the regulator to fall, keeping output current within safe levels).

It will be appreciated that the inventive LNA in its broadest sense is not restricted to using a particular type of voltage regulator circuit. In other words, embodiments of the invention may comprise voltage regulator circuits of various types. For example, the voltage regulator circuit may employ a linear regulator technique. In certain embodiments the voltage regulator circuit employs a switched mode conversion technique (i.e. it may comprise a switched mode converter). The switched mode converter may use an inductor or inductors as the primary energy transfer component or components. Alternatively, the switched mode converter may use a capacitor or capacitors as the primary energy transfer component or components.

The LNA may comprise a calibration resistor, external to the monolithic support IC, arranged to carry a calibration current and the FET control circuit may be arranged to monitor the drain current of at least one the FETs and to monitor the calibration current by means of a pair of transistors, one of the pair of transistors being arranged to carry the drain current and the other transistor being arranged to carry the calibration current. The control circuit may then be arranged to compare the FET and calibration monitor currents, producing a gate drive signal that forces the FET current to match calibration current.

In certain embodiments the pair of transistors are ratioed (i.e. the FET monitor current is a set ratio smaller than the actual FET current), allowing the calibration current to be much smaller than the FET current yet still precisely controlling it.

The FET control circuit may be arranged to provide independent drain current and drain voltage control to at least two of the FETs.

In certain embodiments the LNA comprises a FET arranged as a mixer (i.e. in a mixer configuration). The FET control circuit may then be arranged to provide independent drain current and drain voltage control to the mixer FET.

The LNA may further comprise a mixer calibration resistor, external to the monolithic support IC, arranged to carry a mixer calibration current, the FET control circuit being adapted to monitor the mixer calibration current.

The FET control circuit may be arranged to monitor the mixer FET drain current and the mixer calibration current by means of a pair of transistors arranged to carry the respective currents.

In certain embodiments the LNA comprises first, second, third and fourth FETs, the FET control circuit being arranged to selectively disable the first and second FETs according to the detected DC level, and the fourth FET being arranged in a mixer configuration. The third FET may be arranged in an amplifier configuration.

According to another aspect of the present invention there is provided a monolithic support IC as defined by claim 38.

LNAs embodying the invention may be DBS LNAs.

It will be appreciated that certain embodiments of the invention provide the advantage that, by integrating all power supply and low frequency (LF) functions into one monolithic IC, the cost of a DBS LNA can be greatly reduced.

Integrating all LF functions in a single IC allows substantial PCB area saving by eliminating device to device wiring. Further savings are possible by eliminating the need for any support components by solution improvements.

Further advantages provided by embodiments of the invention will be appreciated from the following description.

BRIEF DESCRIPTION OF THE FIGURES

Embodiments of the present invention will now be described, by way of example only, with reference to the accompanying drawings of which.

DETAILED DESCRIPTION OF EMBODIMENTS OF THE INVENTION

Figure 1:
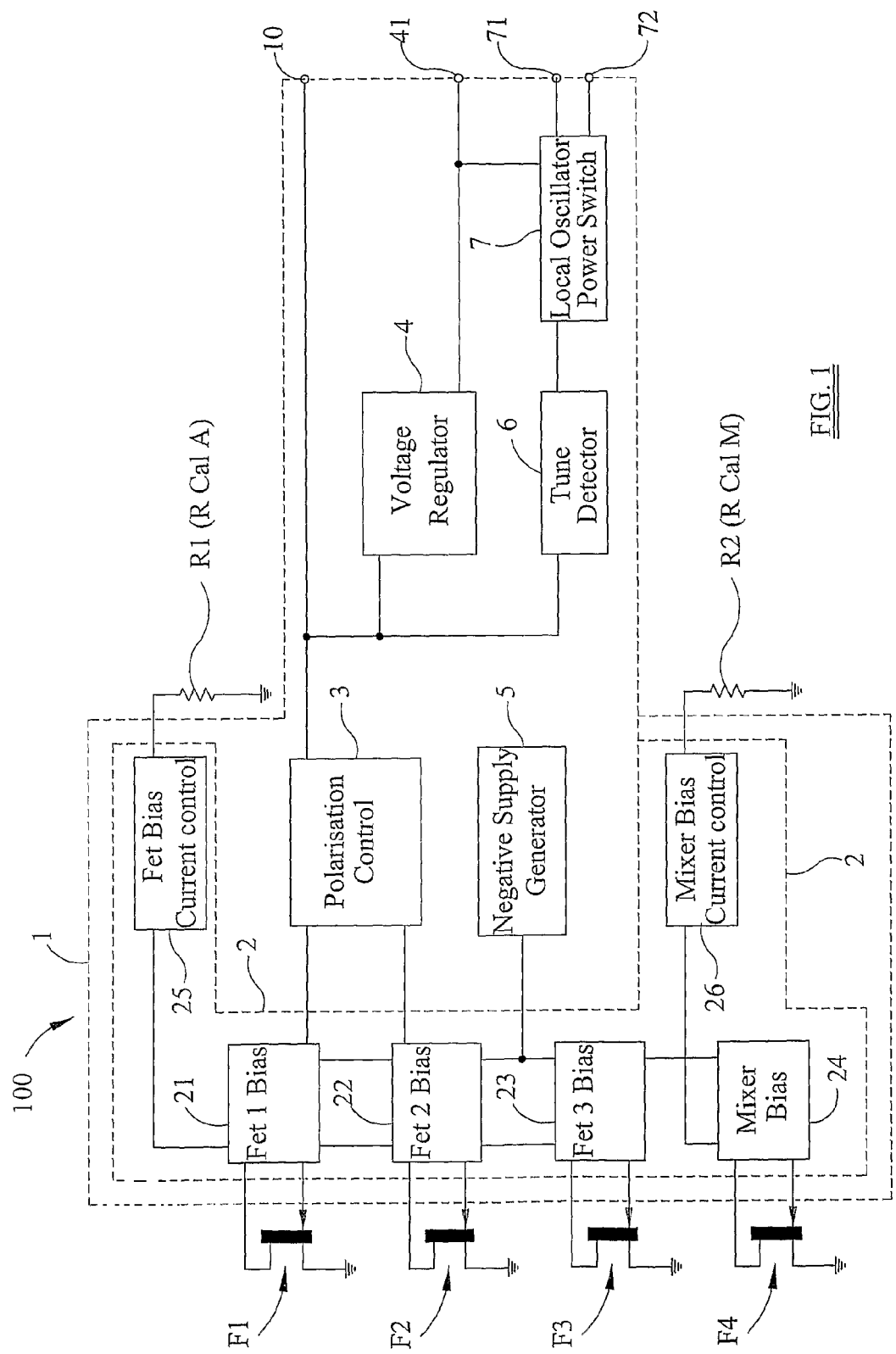
FIG. 1 is a schematic representation of part of a DBS LNA embodying the invention.

Referring now to FIG. 1, this illustrates part of a DBS LNA embodying the invention, and which incorporates a monolithic support IC 1 which is itself also an embodiment of the invention. In addition to the support IC 1, the LNA comprises a number of external components, which include four FETs F1, F2, F3 & F4 and two calibration resistors R1 and R2. Electrical power to operate the LNA is supplied to power input terminal 10 and the support IC 1 includes a voltage regulator 4 arranged to generate a regulated voltage supply from that power input for powering both on-chip and off-chip components. The support IC 1 includes a FET control circuit 2 which is arranged to monitor and control the drain currents of each FET and generally to set the bias conditions (in terms of bias currents and bias voltages) for all of the external FETs. This FET control circuit 2 can be regarded as comprising first, second and third stages 21, 22, 23 arranged to control the bias of FETs F1, F2 & F3 respectively. A fourth stage 24 controls the bias of FET F4 which is arranged in a mixer configuration (not shown in the figure) to receive an RF input signal and a signal from one of two local oscillators of the LNA (the local oscillators are not shown in the figure) and produce a signal at an intermediate frequency. The FET control circuit also includes a FET bias current control stage 25 which controls the bias current of FETs F1, F2 & F3. This bias current control stage 25 is connected to the external calibration resistor R1, through which a calibration current flows. The bias current control stage 25 senses this calibration current, and this feature will be described in more detail below. The FET control circuit also comprises a mixer bias current control stage 26 arranged to sense the mixer calibration current through a second calibration resistor R2 and to provide independent control of the bias current through mixer FET F4.

The monolithic support IC 1 also comprises a polarisation control circuit 3, which can also be described as a FET selection circuit. This circuit 3 is arranged to detect the level of a DC component of the voltage signal supplied to the power input 10 as to provide a FET selection control signal to the PET control circuit 2 according to the detected DC level. In this example, according to the detected level of DC on the power input 10 the polarisation control circuit 3 enables one or the other of FETs P1 and F2 (and of course this can also be described as selectively disabling just one of these two FETs). The FET F1 is arranged to process one input signal polarisation to the LNA, and the second FET F2 is arranged to process a different polarisation. Thus, the polarisation control circuit 3 is able to determine which polarisation of input signal the LNA amplifies according to the DC component of voltage applied to the power input 10. In certain examples this power input is also the RF output from the LNA, and the DC component used to select signal polarisation is provided to the LNA by equipment connected downstream. The monolithic support IC also comprises a negative supply generator circuit 5 arranged to generate a negative supply using the regulated output voltage from the regulator 4. This negative supply is provided to the FET control circuit which in turn is then able to provide negative control voltages to the external FETs. In certain embodiments the negative supply generator 5 is also arranged to provide the negative supply to other components of the LNA, external to the support IC 1.

The support IC 1 in FIG. 1 also comprises a tone detector circuit 6 arranged to detect the presence or absence of a AC control component (i.e. a control tone) on the signal provided to the power input 10. The tone detector 6 in turn provides a detection signal to a local oscillator power switch circuit 7 which, according to the presence or absence of the control tone, feeds regulated power supply from the voltage regulator 4 to one or the other of a pair of output terminals 71, 72. Terminal 71 is arranged to supply power to a high-band local oscillator incorporated in the LNA, and terminal 72 provides power to a second, low-band local oscillator.

The LNA of FIG. 1 will now be described in more detail. As mentioned above, FIG. 1 is a block diagram of components of a single universal DBS LNA 100 that comprises a completely monolithic LF support IC 1. The blocks include FET control 2 (providing bias control and FET current setting), polarisation switch control 3, negative supply generator 5, tone detector 6, LO switch 7, internal voltage reference and power regulator 4.

The FET bias control stages protect and control the operation of the several GaAs FETs F1-F4 needed for processing RF signals, which in certain embodiments can be in the range of 5-15 GHz. These depletion mode FETs need well regulated drain voltage supplies, drain current monitoring and control, over-voltage and over-current protected gate drivers that must be cable of sourcing voltages below ground potential.

User control over FET drain operating current is usually required to control both noise performance and gain. Embodiments of the invention partly follow previous partial integration attempts by allowing the user to set drain current with a single external resistor R1 (also referred to as RcalA) that sets up a calibration current. However, experience from these previous attempted integrations has shown that the task of matching (high) drain current monitoring resistors with (low) calibration current monitors leads to excessively large internal components. In certain embodiments of this invention, ratioed bipolar or mosfet transistors are used to perform the matching task, leading to significant die area savings without loss of accuracy.

Many types of DBS LNAs must meet the requirement of being operable to select between one of two input signal polarisations, typically between vertical and horizontal, or between clockwise and anti-clockwise. This has been achieved by selectively enabling one of two input amplifier FETs (each one receives and amplifies one polarisation only). The outputs from both FETs are added and then fed to the next RF amplifier stage. Enabling and disabling these stages is a complex operation as input and output RF impedances must be carefully maintained/controlled if isolation (between polarisations), gain and noise performance is to be maintained. Two design variants have been developed to support this selection in embodiments of the invention. The first technique employed by embodiments of the invention disables the unwanted polarisation by driving the gate of the appropriate FET to a large but controlled negative voltage, completely cutting off all drain current in the device. The drain supply is also disabled, allowing addition of the two polarisation signals using direct connection of the two drains. The second variant, in alternate embodiments, again disables the unwanted polarisation by disabling the drain supply, but it also drives the gate of the appropriate FET to 0V. Being a depletion mode device, the FET is thus driven into a low resistance state (rather than being open circuit as with the first method). LNA designers may prefer the consistency of impedance matching given by this alternate polarisation control. DBS LNA polarisation may be controlled by variation of the DC power supply voltage provided via the RF downfeed cable. Common levels are 13V input or 18V input, to select one or the other of the two polarisations. By integrating power supply regulation into the support IC in embodiments of the invention, this polarisation signal is available without any extra input pins on the package. The extra tasks that are performed in embodiments of the invention to allow this saving is effective filtering out of all unwanted system noise and alternate control signals, without the use of any external components. This is a non trivial task, as allowances for cable voltage drops and controller inaccuracies can reduce the required control signal threshold range to as little as 14.2V to 15.2V. Also, this capability is provided in the presence of AC control signals and noise greater in amplitude than the remaining detection range. Embodiments of the invention use a combination of filters and delay circuits to achieve the difficult task of accurate DC input level detection using integrated components of acceptable size.

It has already been noted that the GaAs amplifier FETs supported in certain embodiments are depletion mode devices which need supplies below (more negative than) ground to control. Since the common RF/DC supply cable cannot directly provide such a supply, it must be generated within the DBS LNA. The support IC in embodiments of the invention provides this supply without the need for any external components. It may also make the supply available to the LNA designer to use with other/new features not immediately met by initial implementations. In certain embodiments, the negative supply generator uses a standard capacitor charge pump circuit. By operating at a very high frequency (>1 MHz), it can provide sufficient current both for gate drivers and any external requirements without the need for an external pump capacitor. Its output is regulated and current limited in certain embodiments to ensure the external FETs cannot be damaged by excessive gate-source or gate-drain voltages. Novel use of isolation diffusions (described below) are necessary to allow the integration of below ground circuitry in an IC process in which the die substrate is wired to ground. Without these techniques, many extra package pins and external components would have been necessary.

Certain monolithic support ICs embodying the invention are able to support DBS LNAs that include band switching. This is achieved by enabling one of two local oscillators. The signal used to select between bands is a low frequency (e.g. 22 kHz) tone added to the DC feed of the LNA. Hence the downfeed cable may be arranged to pass the received RF signal, a DC feed which both supplies the LNA and selects polarisation, and an AC signal that selects the band received. A tone present may select high band, and tone absent may select low band. As previously mentioned, there may be other signals present on the feed cable for purposes of LNA control. Other signals that may be present are DiSEqC signals, MACAB signals, 60 Hz tones (these are all control signals for other equipment that may share the same feed cable), along with power supply noise and interference caused by the LNA itself. The wanted tone must be detected reliably in the presence of many sources of interference. Certain embodiments of the invention use a combination of filtering, level selection and modulation detection to successfully operate in this harsh environment. All signal processing is done without the need for any external components. The input signal is taken directly from the power input to the IC so no input or filter component pins are required for the tone detector.

In certain implementations embodying the invention, band switching is done by activating high side switches that control the DC supply to the two local oscillators. Alternatively, it can also be achieved by gate control of MIMIC devices. Local oscillator supply switching can be problematic. For reasons of RF stability, the supplies to local oscillators must be heavily decoupled. Switching the supplies hence causes significant supply current transients as supply smoothing capacitors are charged. Since these currents are sourced from the DC input to the LNA, which usually has poor (high) source impedance, large voltage transients can be induced on the DC feed by local oscillator switching. This can cause problems as the transients disrupt the same tone signal input as is used to initiate switching. Embodiments of the invention control local oscillator supply switching in such a way as to completely eliminate supply current transients. This is done using a combination of gating, delay circuits and risetime control.

Integrating a power regulator into the DBS LNA controller (i.e. the monolithic support IC) is an important part of reducing package pin count and inter-component wiring. The power input into the LNA is a variable voltage DC feed with high levels of noise and interference. A high performance regulator is needed to use this source to provide a low noise DC supply to the amplifier GaAs FETs, local oscillators and post-mixer amplifiers present in most LNAs. This regulator must be stable, give high input noise rejection (particularly at 22 kHz) and withstand faults (over current and over temperature) without permanent damage. In embodiments of this invention, the regulator is linked to a voltage reference that provides calibrated voltages for the polarisation detector and the regulator, along with over-temperature detection. The regulator detects over-current by comparing a defined fraction of the output current with an internal reference current. This technique avoids the need to place resistors in the high current input or output paths that could degrade output regulation or minimum input operating voltage.

Certain embodiments utilise a monolithic support IC in the form of a QFN (Quad Flat No-Lead) surface mount package. Integrating all LF functions in the manner described has, in certain examples, reduced the required pin count to only 16 pins. This allows the use of a tiny 3 mm by 3 mm by 0.8 mm package to perform all low LF functions required in a DBS LNA. In this package, the IC die is mounted on a metal pad, the back of which is exposed to the PCB. This pad is soldered down to the top metal of the double sided PCB. The reverse side of the PCB adjacent to the IC must also be metalised and the two metal traces should be connected by two or more plated through hole feed throughs. Furthermore, the PCB should be held firmly against the metal alloy housing adjacent to the IC mounting point. This mounting arrangement will ensure that the junction to ambient thermal resistance of the IC will be low enough to dissipate any power lost in the linear regulator of the power supply. The implementation described achieved a junction to ambient thermal resistance of just 30° C./W when mounted in this manner.

Figure 2:
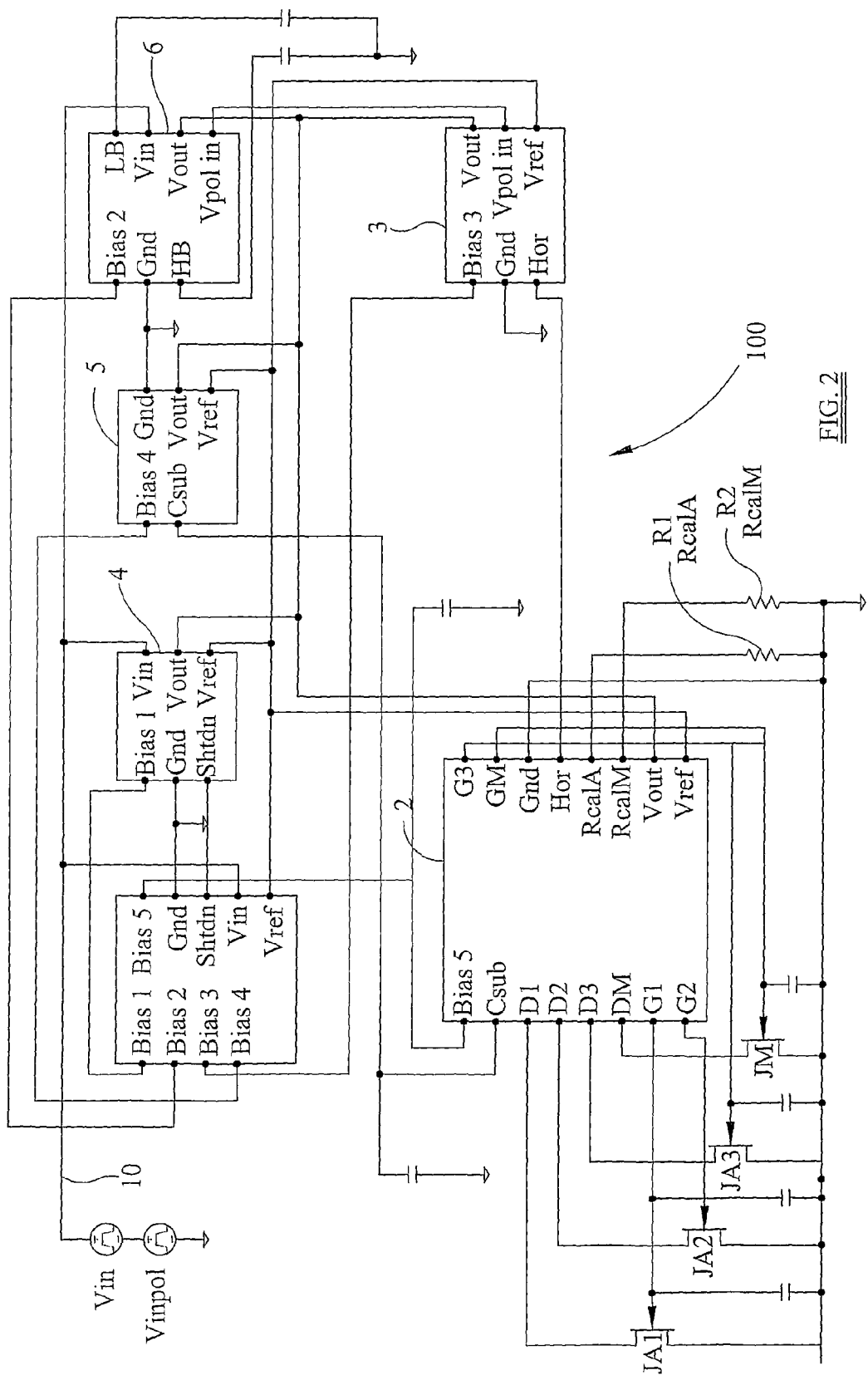
FIG. 2 is a more detailed block diagram of components of another DBS LNA embodying the invention.

A more detailed block diagram of an example of the invention is provided by FIG. 2. This diagram shows the main circuit blocks of the monolithic support IC used in the LNA, and the external components supported by and required with the IC. The IC supports four external GaAs FETs, JA1, JA2, JA3 and JM. Two of the FETs (JA1 and JA2) are used as input amplifiers, one each for either input signal polarisation state, only one of which will be on at any one time. A third FET JA3 is permanently powered and is used as an amplifier. The fourth FET JM is used as a mixer. The drain currents of the amplifier FETs and the mixer FET are user set using two 'calibration' resistors R1, R2. The IC provides power outputs for two local oscillators, low band and high band. It also supplies power to any IF band amplifiers required. All circuits are powered from an internal regulator 4, supplied via pin Vin. This pin acts not only as a supply input, but also feeds a voltage comparator 3 for polarisation state control, and a tone detector 6 for low band/high band control. The circuit blocks will now be described in more detail.

Figure 3:
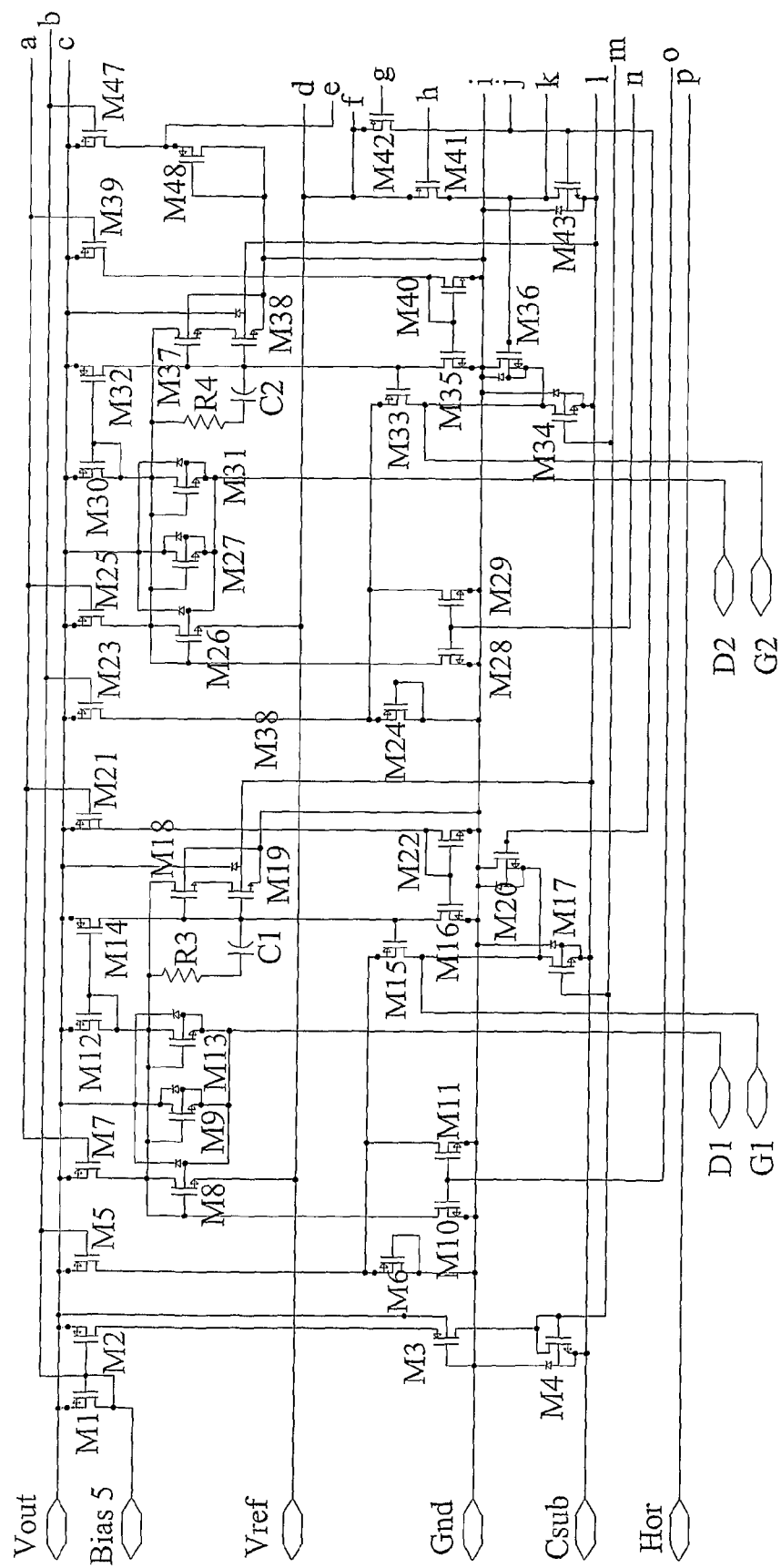
FIG. 3 is a circuit diagram of a FET bias control circuit from a monolithic support IC embodying the invention.
Figure 3:
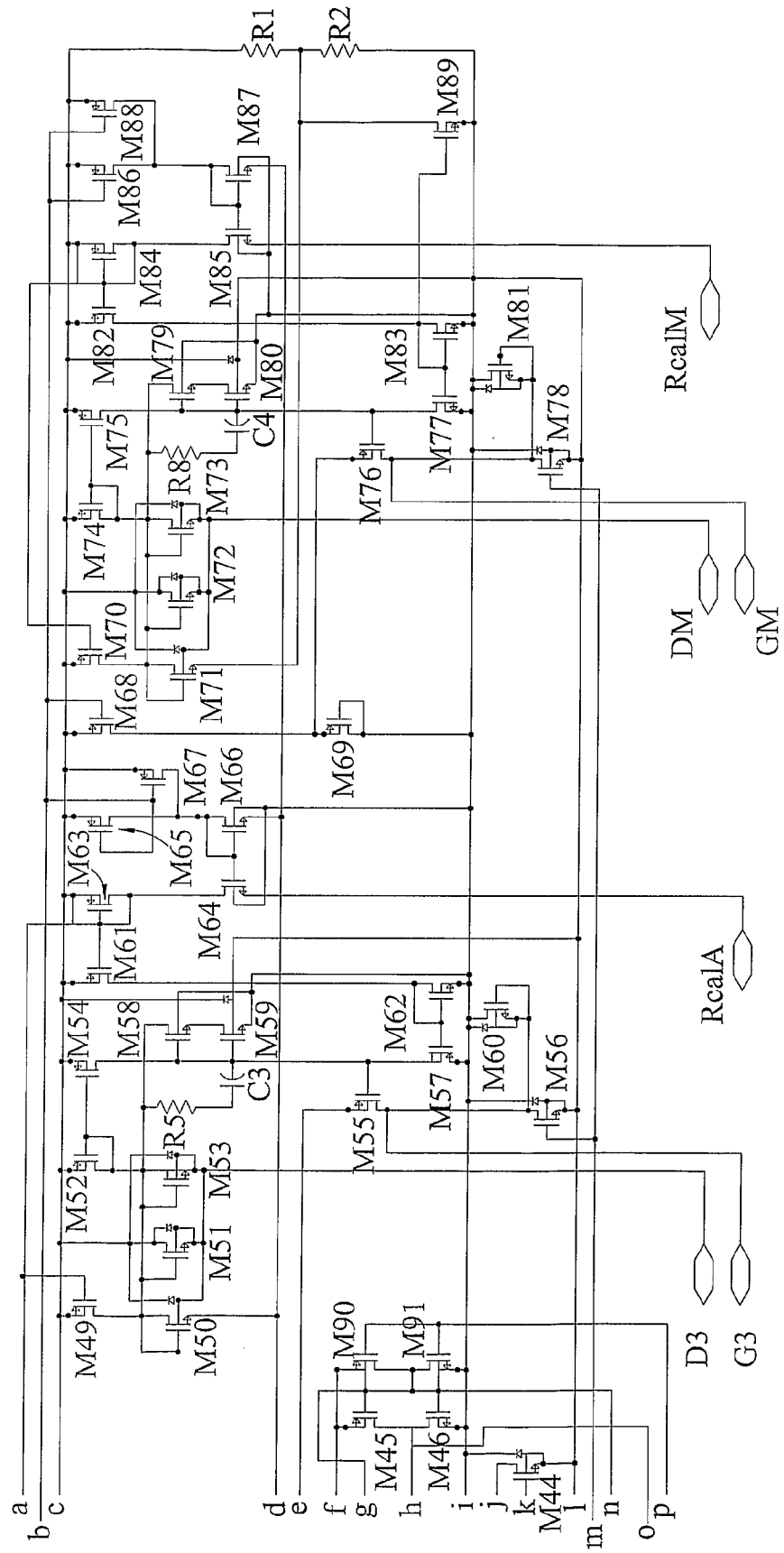

The FET bias control circuit 2 controls the operating conditions of each of the four external GaAs FETs, and is shown in FIG. 3 (which is split into FIG. 3a and FIG. 3b, with the interconnections between the two halves being denoted by letters a-p). It provides a stable, current limited drain voltage supplies. It monitors the drain current of each FET and adjusts the associated gate drive to force the FETs to operate at the requested drain current. In this example, it provides 'zero-gate voltage' switching polarisation control. The main elements of the circuit are most easily described by looking at FET bias stage-3 in FIG. 3 which uses pins D3, G3 and RcalA, and internal mosfets M47 through to M67.

D3 output voltage is set by an internal voltage reference connected to the source of M50. M50 is used to compensate for the operating gate-source voltage drop of M51 which largely supplies the output current of pin D3 (99%). This compensation includes process spreads, temperature and load current effects. For the load current compensation to be accurate, the current fed to M50 (by M49) must be some fixed ratio of the expected output current of D3 (in this case, one hundredth since M51 is 100 times wider than M50).

Using a similar technique, M66 and M64 work together to force the same reference voltage across an external resistor connected from pin RcalA to ground (although here the compensation achieved covers only process spreads and temperature effects). The reference current so created is mirrored round by M63 and M61 (size ratio of 5:1) then M62 and M57 (ratio 1:1) to create a current one fifth that of the RcalA pin current, flowing in the drain of M57.

Although 100 times smaller, M53 operates with the same gate-source voltage as M51 and consequently passes a drain current related to that of M51 (but 100 times smaller). This is mirrored round by M52 and M54 (size ratio of 5:1) to give a current that is 1/500 that of the output current of D3. The drain of M54 feeds the drain of M57 and hence the voltage on this node is dependent on the difference of two current sources, one source set by RcalA and the other related to D3 output current. Hence if the load current supplied via pin D3 is greater than 100 times the RcalA current, the drain current of M54 will be greater than that of M57 and the voltage on the commoned drains will swing positive. If the load current on D3 is too small, the swing will be negative.

Mosfets M48 and M55 make up a simple differential amplifier with M47 providing a constant current to their commoned sources and M56 acting as a constant current drain load for M55 (note M56 is sourced from a negative supply to enable correct control of grounded source depletion mode devices). When the gate of M55 goes positive, the device turns off and its drain goes negative, driving the G3 pin low. When the gate of M55 goes negative, its drain goes positive, driving the G3 pin high. Hence, when the load current on D3 is too high (i.e. the external N-channel depletion mode FET is passing too much current), the G3 pin is driven low (turning off the external FET). This control system matches the current passed by an external FET to a fixed ratio of current passed by RcalA. The current supplied to the G3 pin is sourced by one of two current sources, M47 and M56. This means that the maximum gate drive to the external FET is capped to a well defined and safe level.

If the external FET or its wiring is faulty and it passes an uncontrollable drain current, the voltage on the commoned drains of M54 and M57 swings positive. This turns on M59 and M58, pulling the gate of M51 down to whatever voltage is required to stop the excessive current flowing. This acts as an effective current limit, capping overload current from D3 to a level only marginally higher than normal operating levels.

Stages of the circuit of FIG. 3 relating to D1/G1 and D2/G2 differ from the third stage described above only that they include circuitry to add polarisation switching that ensures only one of the two stages is functional at any one time. All other features are the same and the same RcalA reference current is used as a standard. Stage DM/GM differs in that it uses a lower (Vcc defined) reference voltage to set the DM voltage and it also has a dedicated drain current control (via RcalM).

Previous attempted integrated implementations have used resistors to sense both drain current and Rcal current, but because of the very large difference in values, these resistors either had to be very large or suffered from poor matching. In embodiments of the invention (such as the design shown in FIG. 3), pairs of either bipolar or mosfet transistors (that can be made to match very well, differing only in area) are used to sense these dissimilar currents with great accuracy. Great area savings and other advantages (such as greater dynamic range) can be obtained using the method described above.

Figure 4:
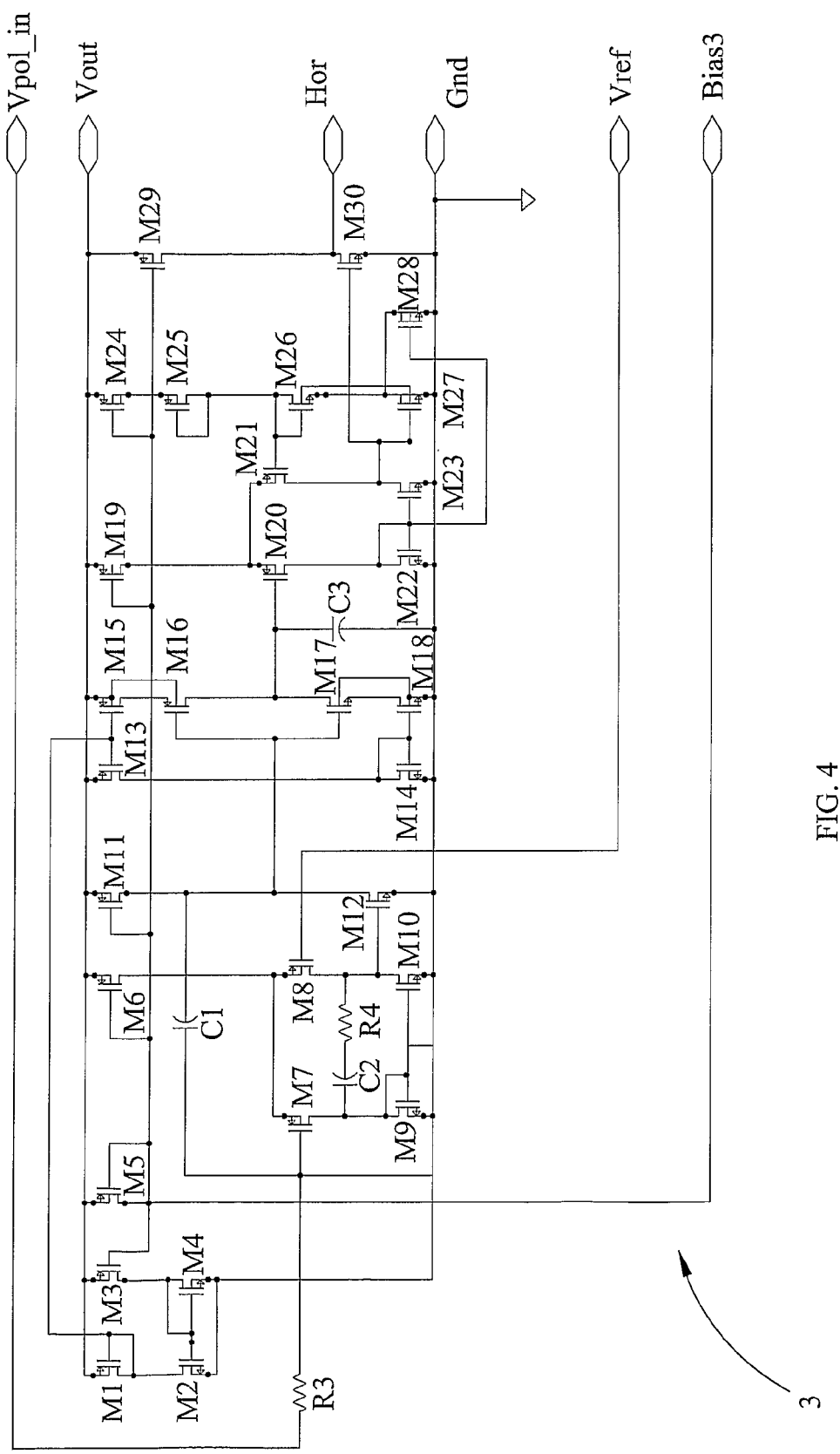
FIG. 4 is a circuit diagram of a polarisation detector incorporated in a monolithic support IC embodying the invention.

The polarisation detector circuit 3 from FIG. 2 will now be described with reference to FIG. 4. The voltage applied to the Vin pin is divided down and then fed to the polarisation voltage detector (at Vpol_in). Here it is fed into the input of a combined integrator/comparator circuit built using mosfets M7 through to M12. M7 and M8 form a differential pair comparing the input voltage with a reference voltage. The output of the amplifier is fed back by capacitor C1 to give an integrating function with R3. This circuit provides an output which is the result of the comparison of the DC input level with the reference. When the input has AC interference that makes the input vary around the threshold level, the combined integrator strips off medium to high frequency noise, allowing accurate resolution of the DC input level. In this implementation, the DC threshold of the detector has been set in the range of 14.2V to 15.2V, but this level is easily adjusted by varying the ratio of the input divider.

The output of the comparator is used to operate one of two switched current sources (M15 and M18), charging a capacitor (C3) to Gnd or Vcc dependent on the comparator output state. By making these current sources very small, a significant delay is generated which further enhances Vin noise immunity.

The output of the delay circuit is then fed to a Schmitt Trigger circuit comprising M19 through to M30 that provides a jitter free output from the slowly changing voltage on C3. This output is fed to the FET Bias Control circuit 2 to exercise control over the operating mode of FET stages 1 and 2. In this implementation, the unwanted stage is disabled by switching the drain output open circuit and the gate output to Gnd potential. This will force the external device to exhibit a very low drain-source resistance and no gain. In an alternate implementation (achievable by a simple modification of the circuit presented), the unwanted stage can be disabled by switching the drain output open circuit and the gate output to a negative voltage large enough to completely cut off the external FET (typically −2V). This will force the external device to exhibit a very high drain-source resistance and no gain.

Figure 5:
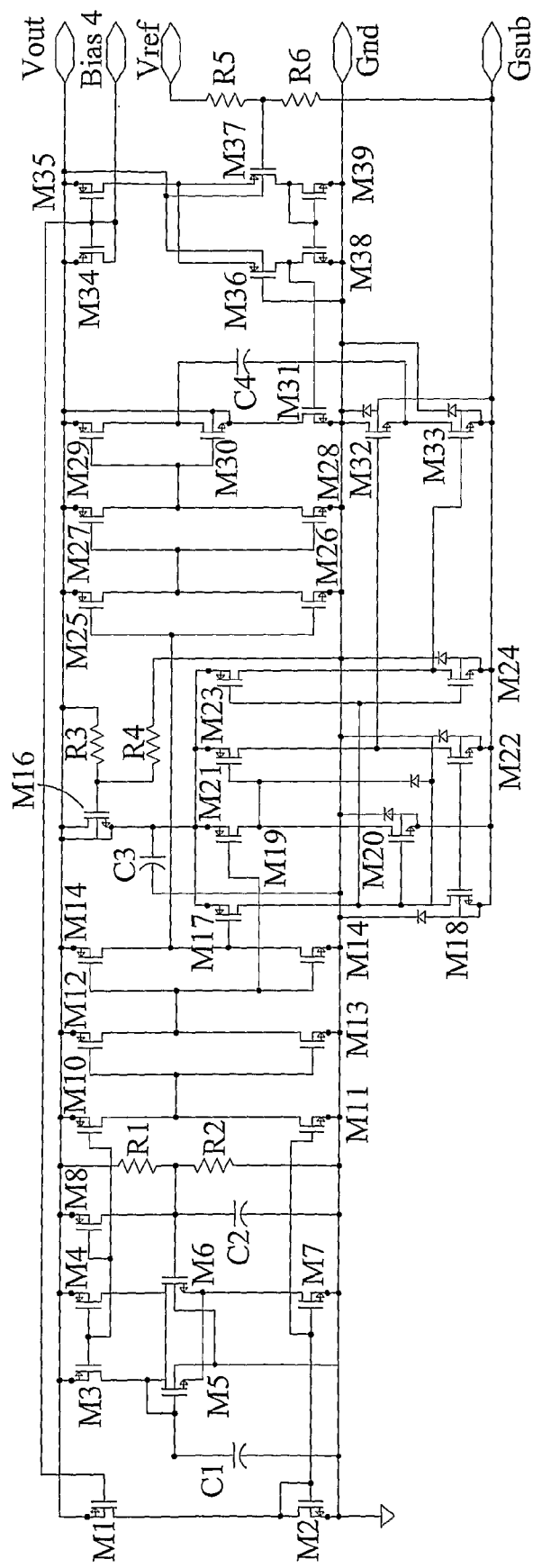
FIG. 5 is a circuit diagram of a negative supply generator from a monolithic support IC embodying the invention.

The negative supply generator circuit 5 is shown in detail in FIG. 5. It is based on a simple charge-pump circuit. Mosfets M3 through to M15 make up a 2-phase square wave output oscillator running at approximately 10 MHz. Mosfets M16 to M20 make up a level translator, providing rail to rail gate drive for N-channel devices with their sources connected to the negative supply output. Mosfets M21 to M24 use these gate drive signals to generate non-overlapping drive signals to M32 and M33, the charge pump output synchronous rectifier transistors. Mosfets M25 to M28 generate a delayed drive signal that matches delays in the rectifier drive circuit. Mosfets M29 and M30 use this drive to generate a square-wave voltage which when coupled by capacitor C4 and rectified by M32 and M33, produces a negative supply on pin Csub. The negative output voltage generated is compared with a voltage reference by a differential amplifier comprised of M36 to M39, the output of which via M31, modulates the amplitude of the square-wave signal driving C4 so as to regulate the generator's output.

Figure 6:
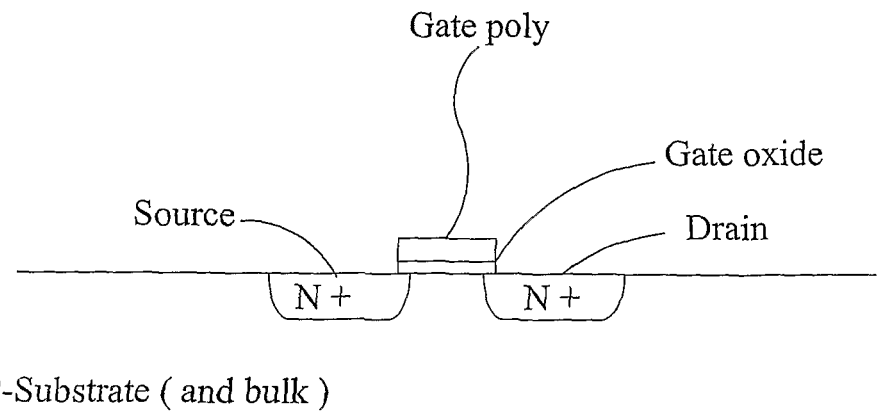
FIG. 6 is a diagram of a standard NMOS transistor.

Note should be taken of the Nmos transistors connected to the negative supply. For reasons of minimising thermal resistance, it is vital that the substrate of this IC is connected to Gnd. This constraint means that any IC components associated with the negative supply must operate below the substrate voltage (0). This would normally violate component to component isolation. The process chosen for this implementation includes an option for N-well isolated Nmos transistors. The were developed to allow the Bulk terminal of the transistors to be biased at voltages more positive than substrate, eliminating performance (gm, Rds(on)) degradation on devices operated with source voltages more positive than substrate. The structure used for a standard Nmos transistor is shown in FIG. 6. It will be noted that just one doping process was necessary to generate all junctions of the device. Also, the wafer substrate forms the body of the FET, degrading performance when the source voltage is elevated.

Figure 7:
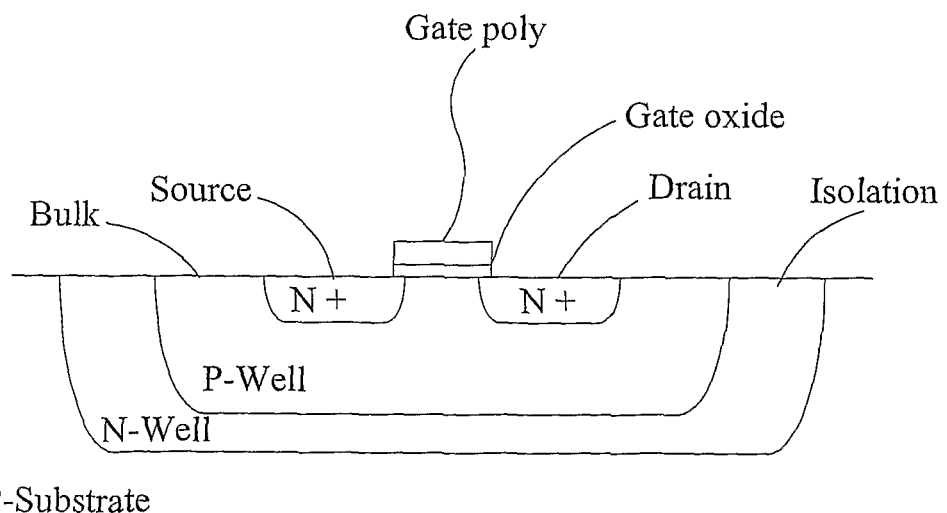
FIG. 7 is a diagram of the structure of an isolated NMOS transistor utilised in embodiments of the invention.

FIG. 7 shows the structure of an isolated Nmos transistor in embodiments of the invention, the structure being arranged to eliminate the performance degradation of the standard device when operated at elevated source voltages. In this structure the transistor is now formed in a P-Well which must be isolated from the P-substrate using an N_Well. The Source and Bulk (P-Well) are normally wired together and the N_Well is normally wired either to the P-Well or some convenient voltage source more positive than the Source/Bulk. With the Bulk/body always at source potential, this transistor will work well whatever the source potential above substrate.

It will be appreciated, however, that the structure can be used in another way. If the N-Well is connected to the substrate, the P-Well can be allowed to go more negative without violating the transistors isolation. Hence, these isolated Nmos transistors can be used to construct circuitry that operates at voltages below (more negative) substrate potential. This capability is utilised in embodiments of the present invention. Not only does it allow the negative supply generator to be constructed on-chip without the use of any external components, it also allows the use of efficient (active) gate drivers for the Fet Bias Control circuit. The grounded substrate and reduced pin count allow standard assembly and low cost packaging to be used whilst still achieving low thermal resistance and hence a high power dissipation capability.

Figure 8:
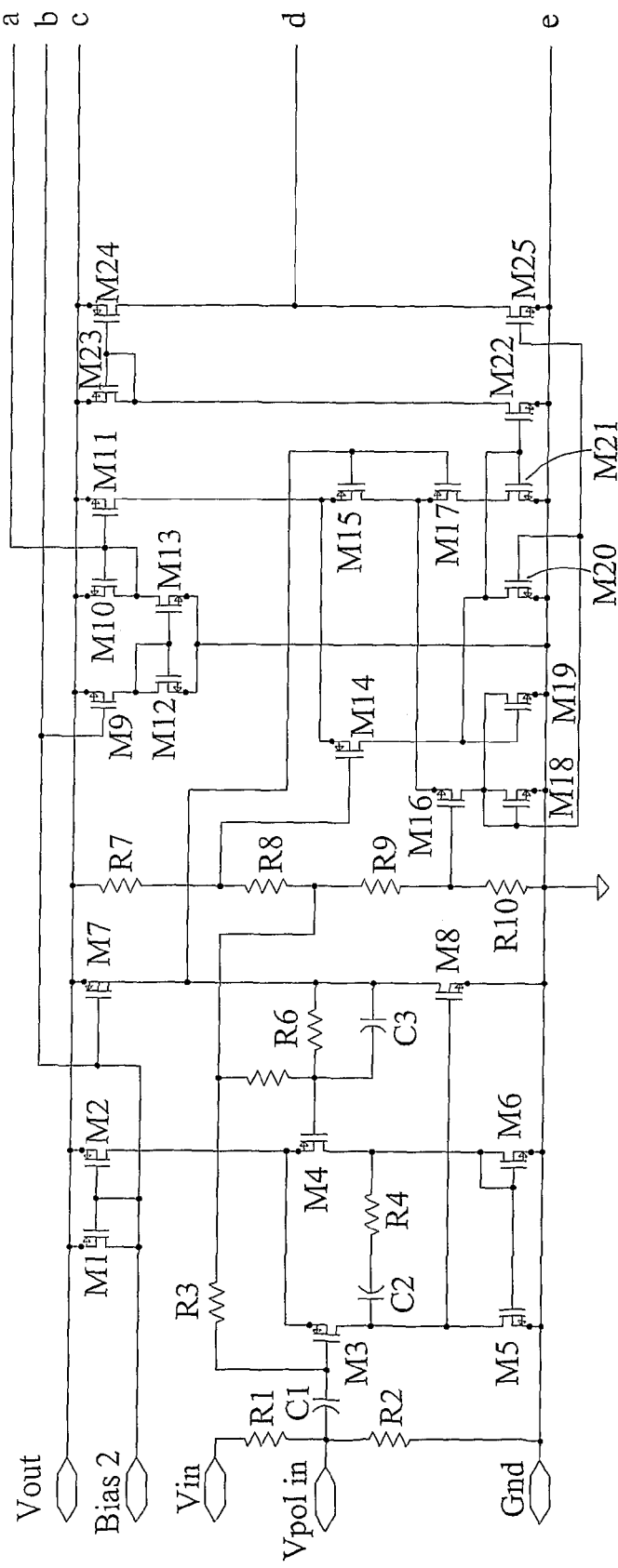
FIG. 8 is a circuit diagram of a tone detector of a monolithic support IC embodying the invention.
Figure 8:
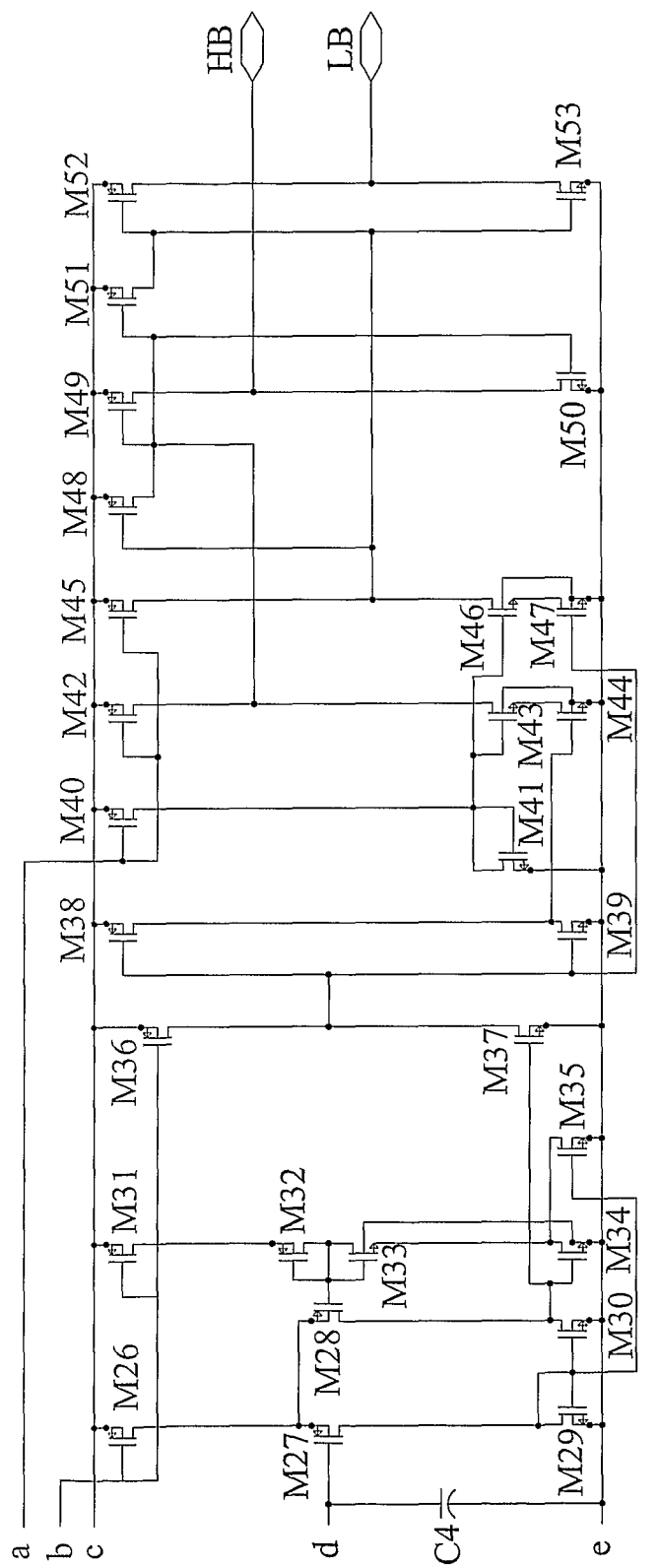

The Tone Detector circuit 6 is shown in FIG. 8 (again split into FIG. 8a and FIG. 8b, with interconnections a-e). The support chip of certain embodiments supports LNA band switching, controlled by the presence or absence of a low frequency tone signal (22 kHz in this implementation) superimposed on the Vin supply to the unit. Transistors M2 through to M8 form an AC coupled amplifier that takes any tone signal on the Vin line and amplify it up to level suitable for further processing. This signal is then passed into a window comparator comprising M9 to M24 that senses the input signal level, giving a logical output (high or low) dependent on the instantaneous output level of the input amplifier. The logical output is in the form of a current fed to C4, pulling positive in the presence of a tone and negative in the absence. By making the output current suitably small compared with the value of C4, the detector can be made to inject little charge to the capacitor for short bursts of interference or data streams intended for other control systems. Thus making the detector immune to common line interference sources. The voltage on C4 is sensed by a Schmitt Trigger comprising M26 to M39 which produces dither-free output transitions as input tone levels are changed. Transistors M40 to M53 form two high-side driver stages controlled by the tone detector. These are interlinked to ensure only one can be active at any one time and so that switching transitions are slow (minimising current change induced interference on the Vin supply—the source of the controlling tone signal). In this implementation, these drivers can source up to 50 mA and hence can drive most local oscillator circuits directly.

Figure 9:
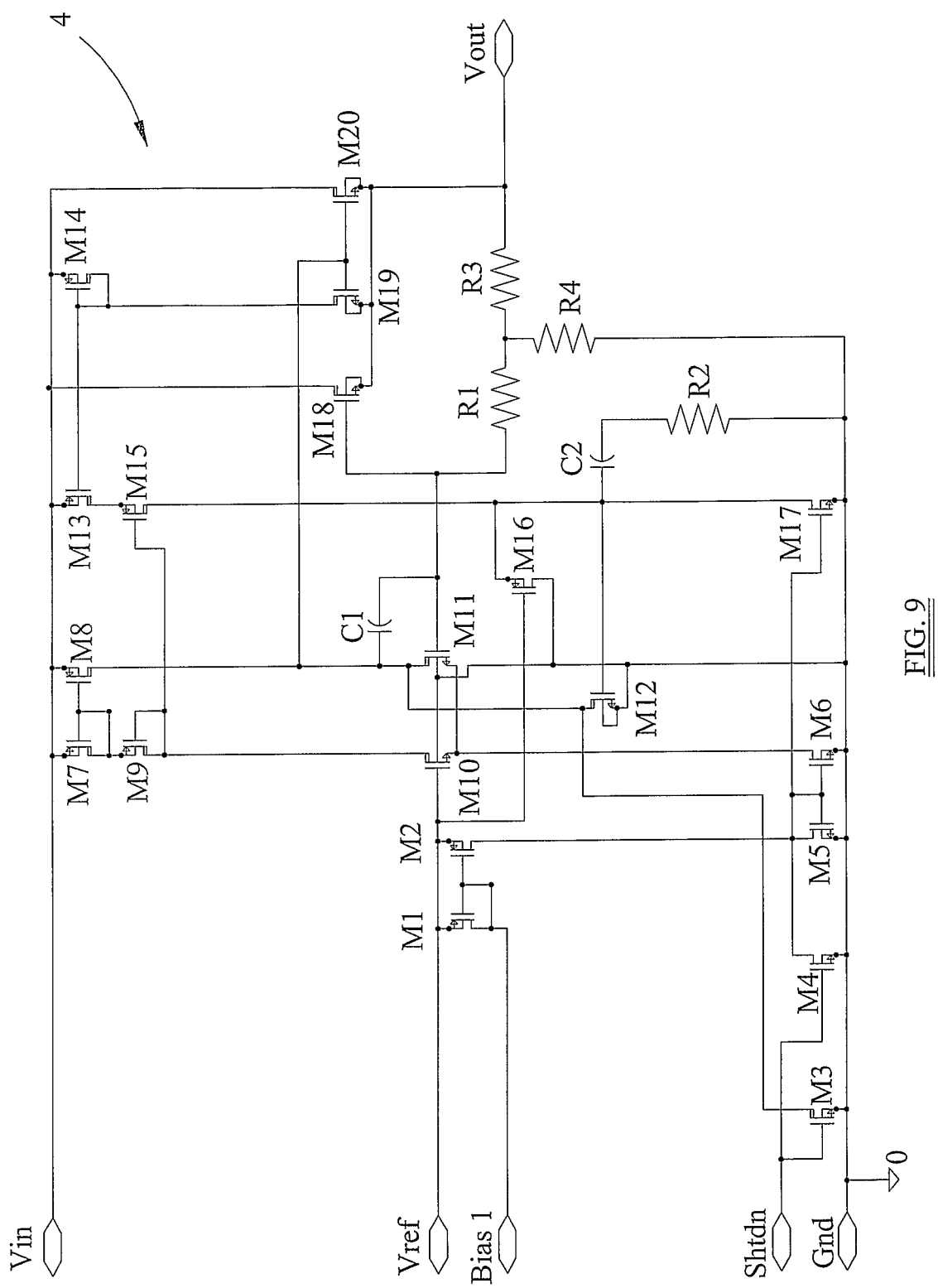
FIG. 9 is a circuit diagram of a power regulator from a monolithic support IC embodying the invention.

The Power Regulator circuit 4 of the LNA shown in FIG. 2 is shown in detail in FIG. 9.

This integrated power regulator (on the support IC) allows the elimination of device to device wiring, saving PCB board space and package pins. In this implementation, the regulator generates a 5V supply, current limited to 120 mA, using a separate 2V band-gap reference for Vout control. (The reference also instigates regulator shutdown in the event of excessive die temperature.)

Transistors M10 and M11, wired as a differential amplifier, compare the 2V reference with a divided down version of the regulator output. Via power output device M20, this amplifier compensates for any voltage errors at Vout. With commoned gate and source connections with M20, M19 supplies a small fraction of the output current (1/600) and the drain current of this device is mirrored using M13 to M15 to be compared with a reference current supplied by M17. If the output related current is smaller than the reference, the regulator is allowed to operate normally. If greater, the gate of M12 is pulled positive, turning the FET on, which in turn, pulls down on the gate of M20 to reduce the output current to a safe level. Note this method of current limit control avoids the need to place physically large low value resistors in the output current path, saving die area and improving regulator dropout performance (worst-case Vin to Vout voltage drop).

Mosfet M3, which is activated by the shutdown input, has its drain wired to that of M12, disabling the regulator on command. This input is used to disable the regulator in the event of excessive die temperature.

Figure 10:
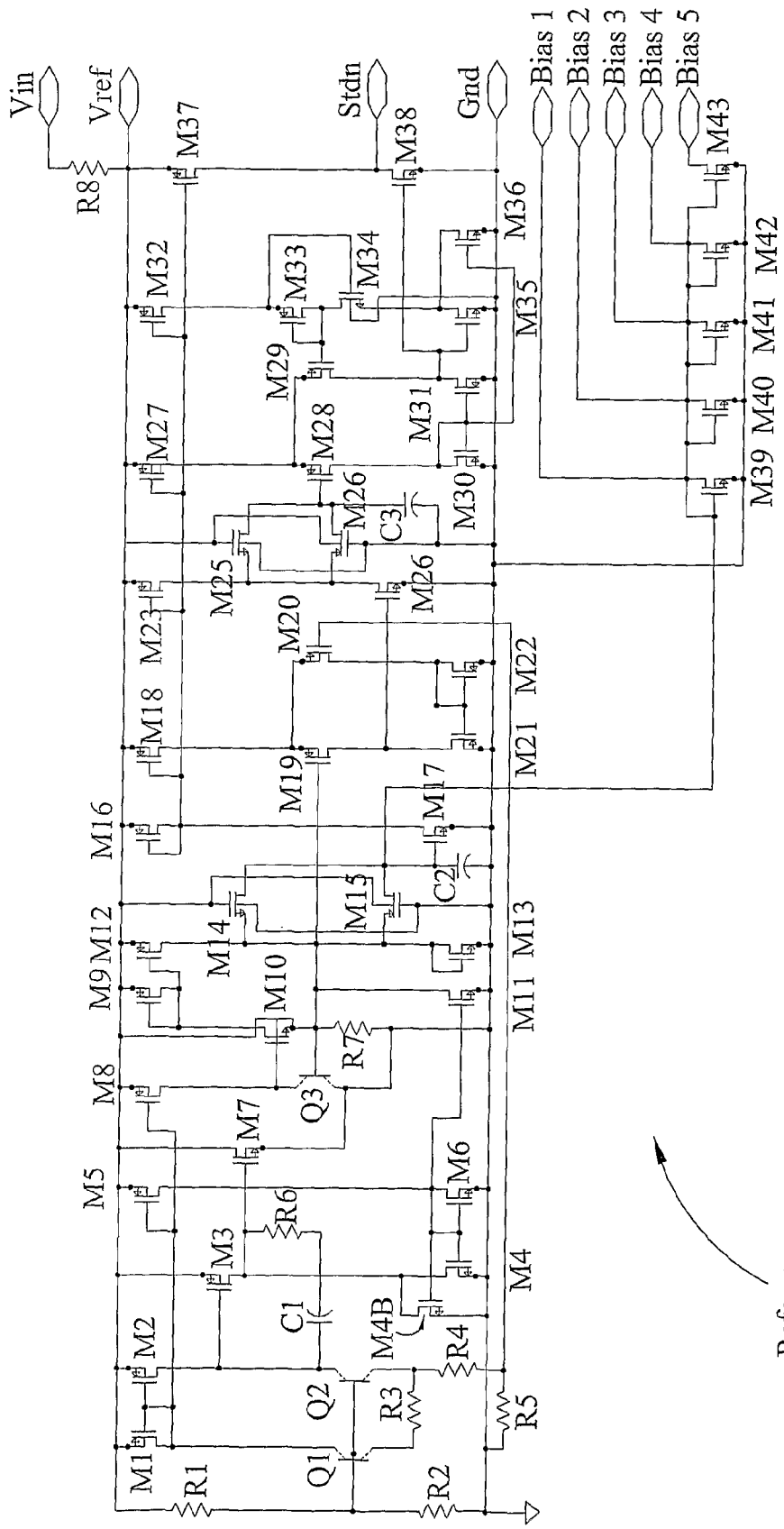
FIG. 10 is a circuit diagram of a reference and bias voltage generator from a monolithic support IC embodying the invention.

The reference and bias generator circuit of FIG. 2 is shown in detail in FIG. 10. This circuit provides a 2V shunt reference and bias generator, supplying all other circuit blocks. As this circuit must function before any other in the design, it is powered directly from Vin via a high value resistor R8.

Bipolar transistors Q1 and Q2 are used to form a standard 1.25V band-gap element that is multiplied up using R1 and R2 to give the 2V reference required. Mosfets M1 to M7 provide the error amplifier and M9 to M15 a low noise temperature compensated bias current reference. This bias reference provides current sources for all IC blocks previously described.

The negative temperature coefficient Vbe of Q3 is compared with the positive temperature coefficient node voltage of the emitter of Q2 using a comparator made up of transistors M18 to M24. This circuit has been designed to toggle its output as the die temperature passes through a pre-defined limit (150° C. in this implementation), chosen as the maximum safe operating temperature.

The invention claimed is:

1. A low noise amplifier (LNA) comprising:
a plurality of FETs arranged to process signals received by the amplifier;
a power input arranged to receive electrical power to operate the LNA; and
a monolithic support integrated circuit (IC),
wherein the monolithic support IC comprises;
a FET control circuit arranged to monitor and control the drain current of each FET;
a FET selection circuit arranged to detect the level of a DC component of a voltage signal supplied to the power input and to provide a FET selection signal to the FET control circuit according to the detected DC level, the FET control circuit being responsive to the FET selection signal to disable a selected one of two of the plurality of FETs;
a voltage regulator circuit connected to the power input and adapted to generate a regulated output voltage from a voltage signal to the power input; and
a negative supply generator circuit connected to receive the regulated output voltage and arranged to generate a negative supply voltage from the regulated output voltage and to provide the negative supply voltage to the FET control circuit, the FET control circuit being arranged to use the negative supply voltage to provide negative gate drive voltages to the FETs.

2. An LNA in accordance with claim 1, wherein the power input is a signal output, the LNA being arranged to output amplified signals from said signal output for receipt by apparatus connected to the signal output.

3. An LNA in accordance with claim 2, wherein said signal output is an RF signal output.

4. An LNA in accordance with claim 1, wherein said FETs are GaAs FETs.

5. An LNA in accordance with claim 1, further comprising means for adjusting the drain current of said FETs.

6. An LNA in accordance with claim 5, wherein said means for adjusting comprises a resistor, the resistance of which determines the drain current of the FETs.

7. An LNA in accordance with claim 6, wherein said resistor is connected between ground and the FET control circuit.

8. An LNA in accordance with claim 1, wherein the FET control circuit is arranged to control the drain current, drain voltage, gate current, and gate voltage of each FET.

9. An LNA in accordance with claim 1, wherein the negative supply generator is arranged to provide the negative supply voltage to at least one component of the LNA that is external to the monolithic support IC.

10. An LNA in accordance with claim 1, wherein the voltage regulator circuit is arranged to supply all power required to operate the components of the LNA external to the monolithic support IC.

11. An LNA in accordance with claim 1, further comprising two local oscillators, and wherein the monolithic support IC further comprises:
an AC signal detection circuit arranged to detect an AC component of a voltage signal supplied to the power input and to provide an AC component detection signal according to the detected AC component; and
a local oscillator (LO) control circuit arranged to receive the AC component detection signal and to selectively operate one of the two local oscillators according to the received AC component detection signal.

12. An LNA in accordance with claim 11, wherein the local oscillator control signal is arranged to selectively operate the local oscillators by selectively switching power supply to the local oscillators.

13. An LNA in accordance with claim 11, wherein the local oscillators are MIMIC oscillators each requiring a gate drive to operate, and wherein the LO control circuit selectively operates the LOs by switching the gate drive.

14. An LNA in accordance with claim 11, wherein the selection of LO operation is arranged to determine a frequency band of operation of the LNA.

15. An LNA in accordance with claim 11, or with any one of claims 15 to 24 as depending from claim 11, wherein the AC signal detection circuit comprises means for rejecting interference signals contained in the voltage signal supplied to the power input in addition to the AC component.

16. An LNA in accordance with claim 15, wherein the AC signal detection means' means for registering interference signals comprises at least one of: a filter; a level detector; a modulation detector; and a delay circuit.

17. An LNA in accordance with claim 1, wherein the FET control circuit is arranged to limit the drain current of each FET in the event of a fault condition.

18. An LNA in accordance with claim 17, wherein the FET control circuit is arranged to limit the increase in drain current under a fault condition to no more than 20%.

19. An LNA in accordance with claim 17, wherein the fault condition is selected from a list comprising: an FET gate short circuit; an FET drain short circuit; any other loading fault.

20. An LNA in accordance with claim 1, wherien said FETs have respective voltage ratings, and the FET control circuit is arranged to provide gate drive voltages to the FETs and to regulate each gate drive voltage so as to be within the voltage rating of the respective FET.

21. An LNA in accordance with claim 1, wherein the two FETs selectively disabled by the FET control circuit in response to the FET selection circuit comprise a first FET arranged to process a received signal having a first polarisation, and a second FET arranged to process a received signal having a second polarisation, whereby the FET selection circuit, by selectively disabling either the first or the second FET, controls which received signal polarisation the LNA amplifies.

22. An LNA in accordance with claim 1, wherein the FET control circuit is arranged to disable the selected FET by applying a gate voltage to cut off drain current through the FET.

23. An LNA in accordance with claim 22, wherein the FET control circuit is also arranged to disable the drain supply to the selected FET.

24. An LNA in accordance with claim 1, wherein the FET control circuit is arranged to disable the selected FET by disabling the drain supply to that FET and applying a gate voltage to that FET to drive it into a low resistance state.

25. An LNA in accordance with claim 1, wherein the FET selection circuit comprises means for rejecting interference signals contained in the voltage signal supplied to the power input in addition to the DC component.

26. An LNA in accordance with claim 25, wherein the means for rejecting interference signals comprises at least one of: a filter; and a delay circuit.

27. An LNA in accordance with claim 1, wherein the voltage regulator circuit comprises over-temperature protection means.

28. An LNA in accordance with claim 1, wherein the voltage regulator circuit comprises over-current protection means.

29. An LNA in accordance with claim 1, comprising a calibration resistor, external to the monolithic support IC, arranged to carry a calibration current and wherein the FET control circuit is arranged to monitor the drain current of at least one the FETs and to monitor the calibration current by means of a pair of transistors, one of the pair of transistors being arranged to carry the drain current and the other transistor being arranged to carry the calibration current.

30. An LNA in accordance with claim 29, wherein the pair of transistors are ratioed.

31. An LNA in accordance with claim 1, wherein the FET control circuit is arranged to provide independent drain current and drain voltage control to at least two of the FETs.

32. An LNA in accordance with claim 1, comprising an FET arranged as a mixer.

33. An LNA in accordance with claim 32, wherein the FET control circuit is arranged to provide independent drain current and drain voltage control to the mixer FET.

34. An LNA in accordance with claim 33, further comprising a mixer calibration resistor, external to the monolithic support IC, arranged to carry a mixer calibration current, the FET control circuit being adapted to monitor the mixer calibration current.

35. An LNA in accordance with claim 34, wherein the FET control circuit is arranged to monitor the mixer FET drain current and the mixer calibration current by means of a pair of transistors arranged to carry the respective currents.

36. An LNA in accordance with claim 1 and comprising first, second, third and fourth FETs, the FET control circuit being arranged to selectively disable the first and second FETs according to the detected DC level, and the fourth FET being arranged in a mixer configuration.

37. An LNA in accordance with claim 36, wherein the third FET is arranged in an amplifier configuration.

38. A monolithic support integrated circuit for an LNA in accordance with claim 1.

* * * * *